United States Patent [19]

Stahlhofen et al.

[11] 3,969,118

[45] July 13, 1976

[54] LIGHT-SENSITIVE O-QUINONE DIAZIDE CONTAINING COPYING LAYER

[75] Inventors: Paul Stahlhofen, Wiesbaden; Rainer Beutel, Florsheim, both of Germany

[73] Assignee: Hoechst Aktiengesellschaft, Germany

[22] Filed: June 17, 1974

[21] Appl. No.: 480,226

[30] Foreign Application Priority Data

June 20, 1973 Germany............................ 2331377

[52] U.S. Cl. .................................... 96/91 D; 96/33; 96/36.3; 96/49; 96/75; 96/86 R; 96/86 P
[51] Int. Cl.² ..................... G03C 1/54; G03F 7/08
[58] Field of Search ................ 96/91 D, 115 R, 75, 96/49

[56] References Cited
UNITED STATES PATENTS

| | | | |
|---|---|---|---|
| 3,046,115 | 7/1962 | Schmidt et al...................... | 96/91 D |
| 3,046,117 | 7/1962 | Sus...................................... | 96/91 D |
| 3,061,430 | 10/1962 | Uhlig et al. ........................ | 96/91 D |
| 3,264,104 | 8/1966 | Reichel............................... | 96/91 D |
| 3,326,682 | 6/1967 | Endermann et al. ............... | 96/91 D |
| 3,495,979 | 2/1970 | Laridon et al. ..................... | 96/91 D |
| 3,635,709 | 1/1972 | Kobayashi........................... | 96/91 D |
| 3,647,443 | 3/1972 | Rauner et al. ...................... | 96/91 D |
| 3,669,658 | 6/1972 | Yonezawa et al. ................. | 96/91 D |
| 3,674,495 | 7/1972 | Esaka.................................. | 96/91 D |
| 3,759,711 | 9/1973 | Rauner et al. ...................... | 96/91 D |
| 3,764,318 | 10/1973 | Laridon .............................. | 96/91 D |

FOREIGN PATENTS OR APPLICATIONS

| | | | |
|---|---|---|---|
| 1,501,184 | 11/1967 | France................................ | 96/91 D |
| 1,039,475 | 8/1966 | United Kingdom................. | 96/91 D |
| 1,180,438 | 2/1970 | United Kingdom................. | 96/91 D |
| 1,041,463 | 9/1966 | United Kingdom................. | 96/91 D |

*Primary Examiner*—Charles L. Bowers, Jr.
*Attorney, Agent, or Firm*—James E. Bryan

[57] ABSTRACT

This invention relates to an improvement in a light-sensitive copying layer containing an ester or an amide of an o-naphthoquinone diazide sulfonic acid or carboxylic acid together with an organic dyestuff and which changes its color shade upon exposure to light, the improvement comprising that it contains, calculated on its total content of o-naphthoquinone diazide compounds, 10 to 75 per cent by weight of a halide of o-naphthoquinone diazide-4-sulfonic acid and, as the dyestuff, an organic compound capable of salt formation in a quantity of 1 to 50 per cent by weight, calculated on the same basis.

3 Claims, No Drawings

LIGHT-SENSITIVE O-QUINONE DIAZIDE CONTAINING COPYING LAYER

This invention relates to a light-sensitive copying layer which contains an o-naphthoquinone diazide compound as the photosensitive substance and a dye, and yields a visible image corresponding to the original after exposure to light.

It is known to use naphthoquinone-(1, 2)-diazide compounds as photosensitive substances for the production of presensitized printing plates. Such sensitized layers are described in German Pat. Nos. 854,890 and 938,233, for example. They have the disadvantage that the yellow naphthoquinone-(1, 2)-diazide layers bleach upon exposure to light to give a faded, yellow light-decomposition product whereby the layer portions not decomposed by the light (image areas) and the light-decomposition products (non-image areas) can be differentiated only with difficulty. In practice, this very often leads to defective copies, particularly upon exposure in so-called step-and-repeat copying machines where a diapositive is projected several times side-by-side on the printing plate. Since the contrast between the image and the non-image areas on the printing plate is poor after exposure, particularly in the presence of yellow light, as is necessary in copying rooms for processing photosensitive printing plates, it is very difficult to perform exact and space-saving registering work.

It is known to overcome this drawback in that a colored organic indicator dye is added in homogeneous distribution to the light-sensitive layer, which dye changes its color in the pH range between 2.5 and 6.5. Furthermore, it is known that o-quinone diazides or naphthoquinone diazides with a leuco dye, after exposure, yield a colored image in the exposed areas (compare U.S. Pat. No. 3,669,658). But it is disadvantageous that the image contrast achieved is not yet sufficient in many cases under conditions in practice. It is also disadvantageous that the image contrast again disappears upon subsequent development.

The present invention provides a light-sensitive copying layer of the above-described kind, e.g. for the production of printing plates, conductor images, screen printing stencils, and photoresists, which layer, after exposure to light under an original, exhibits a reproduction of the original which is richer in contrast than that obtained with conventional copying materials of the same kind and, after development with alkaline solutions, remains rich in contrast. This is achieved by starting from a known copying layer which contains an ester or an amide of an o-naphthoquinone diazide sulfonic acid or carboxylic acid together with an organic dyestuff, and changes its shade upon exposure to light. The copying layer upon which the invention is based contains, calculated on the total content thereof of o-naphthoquinone diazide compounds, 10 to 75 percent by weight of a halide of o-naphthoquinone diazide-4-sulfonic acid and, as the dyestuff, an organic compound capable of salt formation in a quantity of 1 to 50 percent by weight.

It is very probable that the halide of the o-naphthoquinone diazide-4-sulfonic acid present in the light-sensitive copying layer according to the invention is photolytically cleaved upon exposure to light and reacts in a subsequent reaction with the organic dyestuff present, with change of shade, so that, after exposure to actinic light, a marked contrast between the exposed and unexposed areas is obtained. The colored areas not struck by light (image areas), are resistant to the corresponding developer so that, after developing, also a colored reproduction of the original which is rich in contrast is obtained.

The diazo group of the halides of the o-naphthoquinone-diazide-4-sulfonic acid used in accordance with the invention may be in the 1- or 2-position. Due to their better photosensitivity and easier manufacture, the halides of the naphthoquinone-(1, 2)-diazide-(2)-4-sulfonic acid are preferred, however. Surprisingly, only the compounds with the sulfonic acid halide group in 4-position yield the good image contrast after exposure which is achieved in accordance with the invention.

Suitable dyestuffs are, for example, particularly basic dyestuffs from the group of the triphenyl methanes or from the group of the azines, e.g. phenazines, oxazines or dyestuffs from the group of the anthraquinones, e.g. Crystal Violet (42 555), Methyl Violet 2 B (42 535), Malachite Green (42 000), fuchsine (42 510), Crystal Violet carbinol base (42 555 : 1), parafuchsine (42 500), Sudan Blue G (61 520), Acilan Brilliant Blue 5 B (42 740), Acilan Violet S 4 BN (42 640), Astradiamond Green GX (42 040), Rhodamine B (45 170), Samaron Blue GSL (62 500), Victoria Blue B (44 045), Alizarine Direct Blue (62 055), Victoria Pure Blue BOD (42 595), Brilliant Green (42 040), Nil Blue BX (51 185), Neutral Red (50 040) and Rhoduline Pure Blue 3 G (51 004). The numbers in brackets mean the C. I. constitution number used in the five-volume work "Colour Index", Third Edition (1971, London) for identifying the dyestuffs.

Most distinct is the desired image-wise color contrast of the exposed layer when the dyestuff contained therein is red, blue or green. Such dyestuffs therefore are preferably used.

As the photosensitive substance, the copying layers, in addition to the halide of the o-naphthoquinone-diazide-4-sulfonic acid, contain one or more of the above o-naphthoquinone diazide compounds. Their production is described in German Pat. Nos. 854,890; 865,109; 879,203; 894,959; 938,233; 1,109,521; 1,114,705; 1,118,606; 1,120,273; and 1,124,817, for example.

The copying layers of the invention may contain, in known manner, resins, plasticizers, and other conventional additives and auxiliaries usual for light-sensitive layers. The resin content may be considerable and may amount to several hundred per cent of the total content by weight of the o-naphthoquinone diazide compounds, for example.

As copying layer supports, there may be used those conventional for the reproduction methods concerned, e.g. plates or foils from metal, such as aluminum or zinc, with correspondingly pretreated surfaces; furthermore multi-metal plates, e.g. chromium/copper, chromium/copper/aluminum, chromium/copper/zinc; furthermore paper, plastic films, fabrics suitable for screen printing, or metallized plates of insulating material.

With the same content of organic dyestuff capable of salt formation in the copying layer, the image contrast is the more distinct the greater the quantity of the halide of o-naphthoquinone diazide-4-sulfonic acid with respect to the total content of o-naphthoquinone diazide compound of the copying layer. Copying layers with a very large quantity of halide of o-naphthoquinone diazide-4-sulfonic acid have a low storability, particularly when stored in an atmosphere of high humidity. Therefore, the portion of halide of o-naphthoquinone diazide-4sulfonic acid, in accordance with the invention, is limited to a maximum of 75 percent by weight, calculated on the total content by weight of o-naphthoquinone diazide compounds. An increase in the quantity of halide of o-naphthoquinone diazide-4-sulfonic acid, furthermore, entails the disadvantages that less prints result and that the gradation of the copying layer becomes softer which, in most cases, is undesirable. Further, the copying layer is more readily subject to damage upon excessively long action of the conventional alkaline developer solutions or upon the application of excessively alkaline developer solutions. It is therefore most advantageous to maintain the content of the halide of o-naphthoquinone-diazide-4-sulfonic acid, calculated on the total content of o-naphthoquinone diazide compounds, in the range from 10 to 50 percent by weight.

The image contrast after exposure to light and particularly also after development, as is to be expected, is more distinct the greater the content of dyestuff, to be used in accordance with the invention, in the copying layer. In the case of dyestuff contents below 1 percent by weight, calculated on the content in the copying layer of all o-naphthoquinone diazide compounds, the image contrasts after development, however, are very poor; in accordance with the invention, the content of dyestuff thus should be at least 1 percent by weight of the o-naphthoquinone diazide compounds. A distinct image contrast after exposure, as well as prior to and after development of the copying layers, is obtained when they have a content of dyestuff of at least 5.0 percent by weight, calculated as above. Since a considerable dyestuff content of the copying layer yields no advantages but, inter alia, the disadvantage that the copying layer requires longer exposure times than with a lower content of dyestuff, the maximum content of the dyestuff, in accordance with the invention, should be 50 percent by weight, calculated as above. It is more advantageous, however, to have not more than 30 percent by weight of the dyestuff in the copying layer, calculated as above.

By use of the copying layer of the invention, it is possible for the first time to obtain, in the positive-working copying layers known for many years, a distinct color change in the exposed areas by exposure even when the copying layer has a full inherent color due to the dyestuff contained therein. Thus there is obtained an image rich in contrast which, also in the case of yellow illumination, distinctly contrasts with the unexposed areas.

After the removal of the exposed parts with an alkaline developer, there also can be seen a stencil rich in contrast corresponding to the original. Film edges and register marks also copied and which must be removed or corrected after development thus become more distinctly visible. There is thus no need to dye copied film edges to make them more easily visible.

In the following examples, 1 part by volume is 1 ml when 1 part by weight is 1 g.

EXAMPLE 1

1.5 parts by weight of the esterification product obtained by condensing 1 mole of 2,4-dihydroxybenzophenone and 2 moles of the chloride of naphthoquinone-(1,2)-diazide-(2)-5-sulfonic acid,
0.75 part by weight of the chloride of naphthoquinone-(1,2)-diazide-(2)-4-sulfonic acid,
0.35 part by weight of Crystal Violet,
6.5 parts by weight of novolak (softening point 112° to 118°C; content of phenolic OH groups 14 percent by weight),
0.45 part by weight of polyvinyl butyral, and
0.75 part by weight of plasticizer, e.g. phosphoric acid tri-($\beta$-chloroethyl)-ester, are dissolved in a solvent mixture of 80 parts by volume of ethylene glycol monomethyl ether, and
15 parts by volume of butyl acetate.

An aluminum foil roughened by brushing is coated with this solution.

The thus obtained photosensitive printing plate has an intensely blue colored copying layer. After exposure thereof to light under a diapositive, the unexposed areas of the layer remain intensely blue colored, whereas the exposed areas of the layer appear only slightly colored to almost colorless. The image of the original thus can be seen with a good contrast so that it also can be distinctly recognized in all details under yellow light.

If, in the production of the printing plate, the quantity of the chloride of naphthoquinone-(1,2)-diazide-(2)-4-sulfonic acid in the coating solution is eliminated or substituted by a correspondingly increased portion of the above esterification product, only a poor contrast appears, after exposure of the printing plate, between the exposed and unexposed layer areas so that the image, particularly under yellow light, can be recognized in all details only with difficulty.

For the production of a printing form, the exposed printing plate is developed in known manner with an aqueous alkaline solution, the exposed layer areas being thereby removed. The remaining unexposed layer areas remain visible with a good contrast with respect to the uncolored background.

The procedure in the following examples 2 to 10 is similar to that in the above Example 1 and, after exposure of the obtained photo-sensitive printing plates, substantially equivalent results are obtained with respect to image contrast prior to and also after development. In the following examples, therefore, in most cases only the compositions of the coating solutions and the type of the copying layer supports used are indicated; occasionally there are added further brief remarks.

EXAMPLE 2

Coating solution:

0.65 part by weight of the esterification product obtained by condensing 1 mole of 2,3,4-trihydroxy-benzophenone and 2 moles of the chloride of naphthoquinone-(1,2)-diazide-(2)-5-sulfonic acid,
0.73 part by weight of the esterification product obtained by condensing 1 mole of 2,2'-dihydroxy-dinaphthyl-(1,1')-methane and 2 moles of the chloride of naphthoquinone-(1,2)-diazide-(2)-5-sulfonic acid,
0.78 part by weight of the chloride of naphthoquinone-(1,2)-diazide-(2)-4-sulfonic acid,
0.32 part by weight of Crystal Violet base, 6.25 parts by weight of novolak (as in Example 1),
0.52 part by weight of epoxide resin,
0.75 part by weight of plasticizer (as in Example 1), and
90 parts by volume of a solvent mixture as in Example 1.

Copying layer support: as in Example 1.

EXAMPLE 3

Coating solution:

0.94 part by weight of the p-cumylphenol ester of naphthoquinone-(1,2)-diazide-(2)-4-sulfonic acid,
0.81 part by weight of the esterification product obtained by condensing 1 mole of 2,2'-dihydroxy-dinaphthyl-(1,1')-methane and 2 moles of the chloride of naphthoquinone-(1,2)-diazide-(2)-5-sulfonic acid,
0.60 part by weight of the chloride of naphthoquinone-(1,2)-diazide-(2)-4-sulfonic acid,
0.32 part by weight of Crystal Violet,
6.01 parts by weight of novolak (as in Example 1),
0.65 part by weight of a copolymer of (225 parts by weight) ethyl methacrylate and (40 parts by weight) methacrylic acid,
0.75 part by weight of plasticizer (as in Example 1), and
90 parts by volume of a solvent mixture as in Example 1.

Copying layer support: Chromium layer of a trimetal plate of an aluminum supporting foil with a chrome-plated copper layer.

EXAMPLE 4

Coating solution:

1.5 parts by weight of the esterification product obtained by condensing 1 mole of 2,4-dihydroxybenzophenone and 2 moles of the chloride of naphthoquinone-(1,2)-diazide-(2)-5-sulfonic acid,
0.75 part by weight of the fluoride of naphthoquinone-(1,2)-diazide-(2)-4-sulfonic acid,
0.35 part by weight of Victoria Blue B,
5.2 parts by weight of novolak (as in Example 1),
1.0 part by weight of vinyl chloride copolymer (Lutofane 200 L), and
90 parts by volume of a solvent mixture as in Example 1.

Copying layer support: Brushed aluminum foil.

EXAMPLE 5

Coating solution:

1.5 parts by weight of the esterification product obtained by condensing 1 mole of 2,3,4-trihydroxy-benzophenone and 2 moles of the chloride of naphthoquinone-(1,2)-diazide-(2)-5-sulfonic acid,
0.8 part by weight of the chloride of naphthoquinone-(1,2)-diazide-(2)-4-sulfonic acid,
0.35 part by weight of Astradiamond Green GX,
6.5 parts by weight of novolak as in Example 1, but about half of the phenolic OH groups of which are etherified in known manner with the sodium salt of monochloroacetic acid,
0.8 part by weight of the copolymer from styrene and maleic acid anhydride (Lytron 820),
0.75 part by weight of plasticizer (as in Example 1), and
90 parts by volume of a solvent mixture of 80 parts by volume of ethylene glycol monomethyl ether and 10 parts by volume of butyl acetate.

Copying layer support: polyester film, provided with a hydrophilic precoat.

EXAMPLE 6

Coating solution:

1.5 parts by weight of the esterification product obtained by condensing 1 mole of 2,3,4-trihydroxy-benzophenone and 2 moles of the chloride of naphthoquinone-(1,2)-diazide-(2)-5-sulfonic acid,
0.8 part by weight of the fluoride of naphthoquinone-(1,2)-diazide-(2)-4-sulfonic acid,
0.35 part by weight of Sudan Blue G,
6.5 parts by weight of novolak (as in Example 1),
0.8 part by weight of carbamic acid ester/aldehyde condensate (Uresin B),
0.75 part by weight of plasticizer (as in Example 1), and
90 parts by volume of a solvent mixture as in Example 5.

Copying layer support: Brushed aluminum foil.

EXAMPLE 7

Coating solution:

2 parts by weight of the esterification product obtained by condensing 1 mole of 2,4-dihydroxy-benzophenone with 2 moles of the chloride of naphthoquinone-(1,2)-diazide-(2)-5-sulfonic acid,
0.6 part by weight of the chloride of naphthoquinone-(1,2)-diazide-(2)-4-sulfonic acid,
0.25 part by weight of Samaron Blue GSL,
5 parts by weight of novolak (as in Example 1),
0.5 part by weight of cellulose acetate butyrate (with 17 percent by weight of butyryl, 29.5 percent by weight of acetyl, and 1.5 percent by weight of hydroxyl groups), and
130 parts by volume of a solvent mixture of tetrahydrofuran, ethylene glycol monomethylether, and butyl acetate in a ratio by volume of 5 : 4 : 1.

Copying layer support: a) cellulose acetate film, surface saponified
b) brushed aluminum foil Copying layer thickness: 2 g per m² (dry weight).

EXAMPLE 8

Coating solution:

1 part by weight of the p-cumylphenol ester of naphthoquinone-(1,2)-diazide-(2)-4-sulfonic acid,
1 part by weight of the chloride of naphthoquinone-(1,2)-diazide-(2)-4-sulfonic acid,
0.4 part by weight of Brilliant Green, 3 parts by weight of novolak (softening range 110° to 118°C),
0.2 part by weight of acrylate resin (Synthacryl SC 200), and
120 parts by volume of a solvent mixture as in Example 7.

Copying layer support: paper printing foil.

When the copying layer support is a brushed aluminum foil it is sufficient to use in the above composition 0.6 part by weight of the chloride of naphthoquinone-(1,2)-diazide-(2)-4-sulfonic acid to achieve a good image contrast after exposure to light.

EXAMPLE 9

Coating solution:

4 parts by weight of the esterification product obtained by condensing 1 mole of 2,3,4-trihydroxy-benzophenone with 2 moles of the chloride of naphthoquinone-(1,2)-diazide-(2)-5-sulfonic acid,
2 parts by weight of the chloride of naphthoquinone-(1,2)-diazide-(2)-4-sulfonic acid,
1 part by weight of Rhodulin Pure Blue 3 G,
16 parts by weight of novolak resin (melting range 108° to 118°C),
1.6 parts by weight of a copolymer of acrylic acid and ethyl acrylate (in a ratio by weight of 1 : 9), and
140 parts by volume of a solvent mixture as in Example 7.

Copying layer support: zinc plate, polished.

Development is followed by heating for 15 minutes at 240°C which, after cooling down, is followed by etching for 6 minutes with 6 percent by weight nitric acid. A relief printing form is thereby obtained.

EXAMPLE 10

Coating solution:

1 part by weight of the butyl amide of naphthoquinone-(1,2)-diazide-(2)-5-sulfonic acid,
0.6 part by weight of the chloride of naphthoquinone-(1,2)-diazide-(2)-4-sulfonic acid,
0.3 part by weight of Crystal Violet base,
5.5 parts by weight of novolak (Alnovol PN 430),
0.4 part by weight of polyvinyl butyral, and
100 parts by volume of a solvent mixture of 80 parts by volume of ethylene glycol monomethyl ether and 20 parts by volume of butyl acetate.

Copying layer support: Brushed aluminum foil.

EXAMPLE 11

This example describes the production of a transfer copying material which is useful in the production of electric conductor plates. The copying layer support used is a 0.036 mm thick polyester film pretreated by a brief immersion in 10 percent by weight aqueous trichloroacetic acid solution containing 1 percent by weight of polyvinyl alcohol, and by subsequent drying at 100°C. The light-sensitive copying layer is produced from the coating solution indicated below by application to the support and drying, and is then covered with a 0.025 mm thick polyethylene top film.

In use, the top film is stripped and the copying layer is transferred to a copper layer on a plate of insulating material. The conductor image is produced in known manner by exposure to light, development, and etching. Immediately upon exposure to light, the conductor image is visible with an intense contrast on the copper foil provided with the copying layer so that possible defects can be recognized easily.

Coating solution:

10 parts by weight of the p-cumylphenol ester of naphthoquinone-(1,2)-diazide-(2)-4-sulfonic acid,
10 parts by weight of the chloride of naphthoquinone-(1,2)-diazide-(2)-4-sulfonic acid,
0.6 part by weight of Crystal Violet,
30.8 parts by weight of novolak (as in Example 1),
5.1 parts by weight of polyethylene acrylate, of low viscosity,
5.1 parts by weight of polyethyl acrylate, of high viscosity,
12.8 parts by weight of polyvinyl methyl ether (Lutanol M 40),
25.6 parts by weight of polyvinyl ethyl ether, of low viscosity (Lutonal A 25), and
100 parts by volume of methyl ethyl ketone.

EXAMPLE 12

This example describes a copying layer solution which can be used as a positive photoresist composition for various purposes, particularly for the production of etch resists, e.g., for etching shaped articles and signboards and in the production of conductor images, particularly also in microelectronics. The solution has a long storage life. The type of coating and the layer thickness may be adapted within wide limits to the respective requirements. After exposure to light, the exposed areas are light green and contrast considerably with the unexposed areas which remain intensely blue colored. The exposed areas can be removed easily with an alkaline developer (pH about 12.8).

Without the content of chloride of naphthoquinone-(1,2)-diazide-(2)-4-sulfonic acid, the difference in appearance after exposure to light, of the copying layer between its exposed and unexposed areas is very small.

Composition of the copying layer solution:

1.5 parts by weight of the esterification product obtained by condensing 1 mole of 2,3,4-trioxybenzophenone with 2 moles of the chloride of naphthoquinone-(1,2)-diazide-(2)-5-sulfonic acid,
0.4 part by weight of the chloride of naphthoquinone-(1,2)-diazide-(2)-4-sulfonic acid,
0.1 part by weight of Crystal Violet,
10 parts by weight of novolak (Alnovol PN 430),
2 parts by weight of epoxy resin (Epikote 1001), and
86 parts by weight of solvent, composed of trichloroethylene, isopropanol, and butyl acetate in a ratio by weight of 6 : 3 : 1.

EXAMPLE 13

Coating solution:

2.17 parts by weight of the p-cumylphenol ester of naphthoquinone-(1,2)-diazide-(2)-4-sulfonic acid,
1.02 parts by weight of the esterification product obtained by condensing 1 mole of 2,2'-dihydroxydinaphthyl-(1,1')-methane and 2 moles of the chloride of naphthoquinone-(1,2)-diazide-(2)-5-sulfonic acid,
0.37 part by weight of the chloride of naphthoquinone-(1,2)-diazide-(2)-4-sulfonic acid, 0.12 part by weight of Crystal Violet base,
90 parts by weight of a cresol-formaldehyde novolak (softening range: 112° to 118°C),
43 parts by volume of tetrahydrofuran,
35 parts by volume of ethylene glycol monomethyl ether, and
9 parts by volume of butyl acetate.

Copying layer support: electrolytically roughened and anodized aluminum foil.

EXAMPLE 14

Coating solution:

0.70 part by weight of the esterification product obtained by condensing 1 mole of 2,4-dihydroxybenzophenone and 2 moles of the chloride of naphthoquinone-(1,2)-diazide-(2)-5-sulfonic acid,
0.95 part by weight of the esterification product obtained by condensing 1 mole of 2,2'-dihydroxydinaphthyl-(1,1')-methane and 2 moles of the chloride of naphthoquinone-(1,2)-diazide-(2)-5-sulfonic acid,
0.45 part by weight of the chloride of naphthoquinone-(1,2)-diazide-(2)-4-sulfonic acid,
0.15 part by weight of Crystal Violet base,
5.10 parts by weight of novolak (as in Example 1),
0.15 part by weight of polyvinyl butyral,
0.58 part by weight of plasticizer (as in Example 1),
40 parts by volume of ethylene glycol monomethyl ether,
50 parts by volume of tetrahydrofuran, and
8 parts by volume of butyl acetate.

Copying layer support: mechanically roughened aluminum foil.

EXAMPLES 15 to 19

In these five examples, mechanically roughened aluminum foils are provided with a copying layer by applying coating solutions containing the constituents of the following list dissolved in 92 parts by volume of solvent, composed of 48 parts by volume of tetrahydrofuran, 36 parts by volume of ethylene glycol monomethyl ether, and 8 parts by volume of butyl acetate.

| Parts by weight | Example 15 | 16 | 17 | 18 | 19 |
|---|---|---|---|---|---|
| Diazo A | 0.70 | 0.57 | 0.75 | 0.75 | 0.57 |
| Diazo B | 0.84 | 0.78 | 0.88 | 0.88 | 0.70 |
| Diazo C | 0.18 | 0.45 | 0.18 | 0.18 | 0.45 |
| Crystal Violet | 0.15 | 0.018 | 0.018 | 0.09 | 0.15 |
| Novolak | 5.2 | 5.2 | 5.2 | 5.2 | 5.2 |
| Polyvinyl butyral | 0.18 | 0.18 | 0.18 | 0.18 | 0.18 |
| Epoxy resin | 0.25 | 0.30 | 0.30 | 0.30 | 0.25 |
| Plasticizer | 0.58 | 0.58 | 0.58 | 0.58 | 0.58 |

Diazo A is the esterification product obtained by condensing 1 mole of 2,4-dihydroxybenzophenone and 1 mole of the chloride of naphthoquinone-(1,2)-diazide-(2)-5-sulfonic acid.

Diazo B is the esterification product obtained by condensing 1 mole of 2,2'-dihydroxydinaphthyl-(1,1')-methane and 2 moles of the chloride of naphthoquinone-(1,2)-diazide-(2)-5-sulfonic acid.

Diazo C is the chloride of naphthoquinone-(1,2)-diazide-(2)-4-sulfonic acid. Novolak and epoxy resin are the same as those used in Example 1.

It will be obvious to those skilled in the art that many modifications may be made within the scope of the present invention without departing from the spirit thereof, and the invention includes all such modifications.

What is claimed is:

1. In a light-sensitive supported copying composition in layer form containing an ester or an amide of an o-naphthoquinone diazide sulfonic acid or carboxylic acid together with an organic dyestuff and which changes its color shade upon exposure to actinic light, the improvement that it contains, calculated on its total content of o-naphthoquinone diazide compounds, 10 to 75 percent by weight of a halide of o-naphthoquinone diazide-4-sulfonic acid and, as the dyestuff, a compound selected from the group consisting of triphenyl methane dyes, azine dyes, and anthraquinone dyes in a quantity of 1 to 50 percent by weight, calculated on its total content of o-naphthoquinone diazide compounds.

2. A light-sensitive copying composition according to claim 1 containing 10 to 50 percent by weight of the halide of o-naphthoquinone diazide-4-sulfonic acid, and 5 to 30 percent by weight of the dyestuff, calculated as in claim 1.

3. A light-sensitive copying composition according to claim 1 in which the dyestuff is a red, blue or green dyestuff.

* * * * *